United States Patent
Tsai et al.

(10) Patent No.: US 12,253,549 B2
(45) Date of Patent: Mar. 18, 2025

(54) DECODING METHOD FOR INDUCTION TYPE POWER SUPPLY SYSTEM AND RELATED SUPPLYING-END MODULE

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 444 days.

(21) Appl. No.: 17/735,141

(22) Filed: May 3, 2022

(65) Prior Publication Data

US 2022/0260618 A1  Aug. 18, 2022

(30) Foreign Application Priority Data

Dec. 10, 2021 (TW) ................. 110146282

(51) Int. Cl.
*G01R 21/133* (2006.01)
*H02J 50/10* (2016.01)
*H02J 50/80* (2016.01)

(52) U.S. Cl.
CPC ............ *G01R 21/133* (2013.01); *H02J 50/10* (2016.02); *H02J 50/80* (2016.02)

(58) Field of Classification Search
CPC ............. H02J 50/10; H02J 50/12; H02J 50/80
See application file for complete search history.

(56) References Cited

U.S. PATENT DOCUMENTS

| 7,510,117 | B2 | 3/2009 | Esterberg | |
|---|---|---|---|---|
| 8,810,072 | B2* | 8/2014 | Tsai | H02J 50/80 307/104 |
| 9,048,881 | B2* | 6/2015 | Tsai | H04B 5/72 |
| 9,671,444 | B2 | 6/2017 | Tsai | |
| 9,831,687 | B2 | 11/2017 | Tsai | |
| 9,960,639 | B2 | 5/2018 | Tsai | |
| 10,056,944 | B2 | 8/2018 | Tsai | |
| 10,312,748 | B2 | 6/2019 | Tsai | |
| 10,574,095 | B2 | 2/2020 | Tsai | |
| 10,686,331 | B2 | 6/2020 | Tsai | |

FOREIGN PATENT DOCUMENTS

| CN | 113396543 A | 9/2021 |
|---|---|---|
| TW | 201415752 A | 4/2014 |
| TW | 201842736 A | 12/2018 |

* cited by examiner

*Primary Examiner* — Lam S Nguyen
(74) *Attorney, Agent, or Firm* — Winston Hsu

(57) ABSTRACT

A decoding method for a supplying-end module of an induction type power supply system where the supplying-end module includes a supplying-end coil is provided. The decoding method includes steps of: receiving and storing a plurality of trigger data, each corresponding to a resonant cycle of a coil signal on the supplying-end coil; determining a plurality of rising or falling features in the plurality of trigger data, and marking a plurality of anchor points at positions corresponding to the plurality of rising or falling features; determining whether distances between the plurality of anchor points comply with an encoding interval, to obtain a plurality of valid anchor points from the plurality of anchor points; and obtaining a plurality of data codes according to the plurality of valid anchor points.

20 Claims, 10 Drawing Sheets

DECODING METHOD FOR INDUCTION TYPE POWER SUPPLY SYSTEM AND RELATED SUPPLYING-END MODULE

BACKGROUND OF THE INVENTION

1. Field of the Invention

The present invention relates to a decoding method, and more particularly, to a decoding method for modulation data of an induction type power supply system.

2. Description of the Prior Art

In an induction type power supply system, the power supplying terminal and the power receiving terminal respectively include a coil for performing inductive power transmissions (or called wireless charging). The coil in the power supplying terminal may deliver energies, and the coil in the power receiving terminal may receive the energies and convert the energies to be provided for the usage of loads. During the power transmission process, the power supplying terminal has to know the operational status of the power receiving terminal, to perform power regulation or other related operations; hence, the power receiving terminal should transmit the data associated with its operational status to the power supplying terminal. However, there is no physical circuitry connected between the power receiving device and the power supplying device, and thus the transmission of data should be performed through a wireless scheme.

In currently available induction type power supply products, the communications between the power receiving device and the power supplying device are mainly performed based on amplitude modulation (AM) on the coil. In the system, the power supplying terminal supplies energies through the coil, and the modulation circuit of the power receiving terminal varies the impedance characteristics of the receiving-end coil. The variations are reflected to the supplying-end coil to change the amplitude of the coil signal. The power supplying terminal may thereby detect the amplitude variations on the coil and perform demodulation to retrieve the data content.

The signals on the supplying-end coil are quite complex. Its main signal is the resonant signal generated by the power driving circuit driving the capacitor and coil, and its frequency and phase change rapidly. In addition, the amplitude variations of the signal reflected to the supplying-end coil from the modulation signal at the power receiving terminal are quite weak. The variations and noises on the load at the output terminal may also be reflected to the supplying-end coil and interfere with the signal interpretation.

Currently available products mostly apply a low-pass filter to retrieve low frequency modulation signals from the main carriers in a higher frequency. This technology has several disadvantages: first, the depth of modulation signals should be enough to be filtered out by the filter. Second, the main carrier is a power transmission signal, of which the magnitude changes with power variations, but general filters cannot maintain satisfactory filtering capability in both high power and low power, where with the high power the main carriers have large amplitudes and with the low power the main carriers have small amplitudes. Third, the noises generated from load variations in the power receiving device easily interfere with the operations of the filter. Finally, the filter itself has additional hardware costs.

Therefore, in the technical field associated with the induction type power supply system, the most advanced data analysis method is the signal analysis technique without filter. How to complete the sampling of coil amplitude and convert it into a signal value within an extremely short cycle of the main carrier without using a filter and then accurately analyze the signal value has become an important issue in this art.

SUMMARY OF THE INVENTION

It is therefore an objective of the present invention to provide a signal decoding method for an induction type power supply system and its supplying-end module, which are capable of converting the resonant signals on the coil into trigger data, and accurately analyzing these trigger data to complete the decoding.

An embodiment of the present invention discloses a decoding method for a supplying-end module of an induction type power supply system. The supplying-end module comprises a supplying-end coil. The decoding method comprises steps of: receiving and storing a plurality of trigger data, wherein each trigger data corresponds to a resonant cycle of a coil signal on the supplying-end coil; determining a plurality of rising or falling features in the plurality of trigger data, and marking a plurality of anchor points at positions corresponding to the plurality of rising or falling features; determining whether distances between the plurality of anchor points comply with an encoding interval, to obtain a plurality of valid anchor points from the plurality of anchor points; and obtaining a plurality of data codes according to the plurality of valid anchor points.

Another embodiment of the present invention discloses a supplying-end module for an induction type power supply system. The supplying-end module comprises a supplying-end coil, a signal analysis circuit and a processor. The signal analysis circuit, coupled to the supplying-end coil, is configured to obtain a plurality of trigger data. The processor, coupled to the signal analysis circuit, is configured to perform steps of: receiving a plurality of trigger data from the signal analysis circuit and storing the plurality of trigger data, wherein each of the plurality of trigger data corresponds to a resonant cycle of a coil signal on the supplying-end coil; determining a plurality of rising or falling features in the plurality of trigger data, and marking a plurality of anchor points at positions corresponding to the plurality of rising or falling features; determining whether distances between the plurality of anchor points comply with an encoding interval, to obtain a plurality of valid anchor points from the plurality of anchor points; and obtaining a plurality of data codes according to the plurality of valid anchor points.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
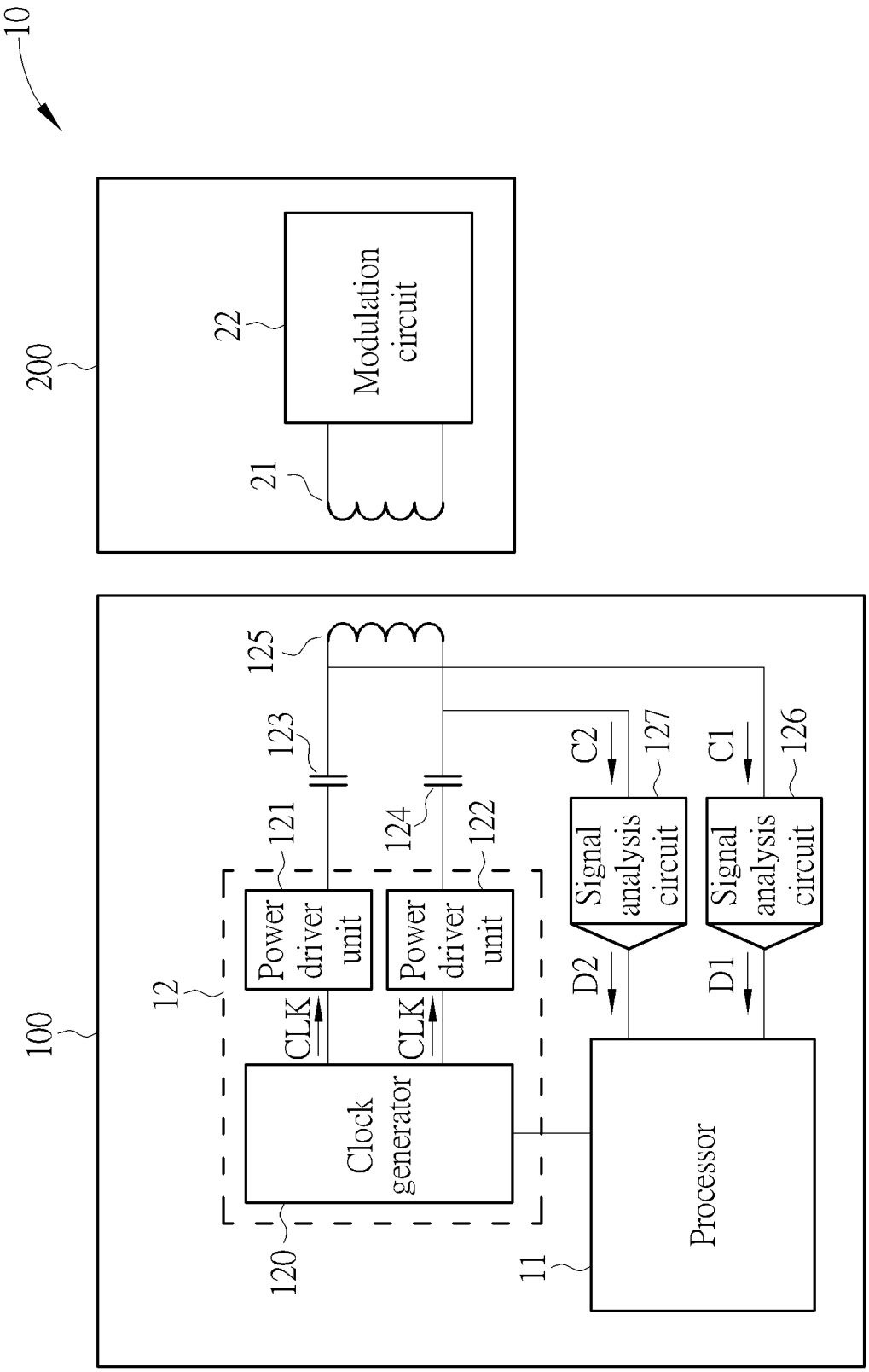
FIG. 1 is a schematic diagram of an induction type power supply system according to an embodiment of the present invention.

Please refer to FIG. 1, which is a schematic diagram of an induction type power supply system 10 according to an embodiment of the present invention. As shown in FIG. 1, the induction type power supply system 10 includes a supplying-end module 100 and a receiving-end module 200. The supplying-end module 100 may receive electric power from a power source (not illustrated), and output wireless power to the receiving-end module 200. The receiving-end module 200 receives the wireless power and then provides power for the back-end load. In order to allow the supplying-end module 100 to perform power regulation or other related operations, the receiving-end module 200 should return data to the supplying-end module 100 through the signal modulation technology. The present invention mainly utilizes in-band communications to realize the transmissions of modulation data on the coil signal.

In detail, the receiving-end module 200 includes a receiving-end coil 21 and a modulation circuit 22. The receiving-end coil 21 may receive the electric energies from the supplying-end module 100. The modulation circuit 22 includes the circuitry capable of performing modulation to feed the signals back to the supplying-end module 100. The modulation circuit 22 may be, for example, a software circuit for using a predetermined encoding protocol to generate a signal string such as a processor or controller, and/or a hardware circuit for driving the receiving-end coil 21 to change its coil impedance to perform the modulation. Other possible elements or modules such as the magnetic conductor, regulation circuit, resonant capacitor and rectification circuit may be selectively included or not depending on system requirements, and thus are omitted herein without affecting the illustrations of the present embodiment.

The supplying-end module 100 includes a processor 11, a power driver circuit 12, resonant capacitors 123 and 124, a supplying-end coil 125, and signal analysis circuits 126 and 127. In the supplying-end module 100, the supplying-end coil 125 is configured to send electromagnetic energies to the receiving-end module 200 to supply electric power. The resonant capacitors 123 and 124 are coupled to the two terminals of the supplying-end coil 125, respectively, and configured to resonate with the supplying-end coil 125 during power supply. The supplying-end coil 125 and the resonant capacitors 123 and 124 are disposed as a C-L-C resonance structure, but those skilled in the art should understand that the resonant capacitor and the coil may be deployed as a single-ended capacitor (e.g., L-C resonance) or other feasible structure, and the deployment is not limited thereto. In addition, in the supplying-end module 100, a magnetic conductor (not illustrated) composed of magnetic materials may be selectively applied to increase the electromagnetic induction capability of the supplying-end coil 125 and also prevent the electromagnetic energies from affecting the objects at the non-inductive side of the coil.

The power driver circuit 12 is configured to control the operations of the supplying-end coil 125 and the resonant capacitors 123 and 124. In detail, the power driver circuit 12 includes a clock generator 120 and the power driver units 121 and 122. The clock generator 120 is configured to generate and output a clock signal CLK corresponding to the output power. The power driver units 121 and 122, which are controlled by the clock signal CLK, are configured to drive the supplying-end coil 125 to generate and deliver energies. When the power driver units 121 and 122 are both active, full-bridge driving is performed. In several embodiments, only one of the power driver units 121 and 122 is active or only one of the power driver units 121 and 122 is disposed, which leads to half-bridge driving. The processor 11 is configured to control the frequency of the clock signal CLK output by the clock generator 120, in order to control the power driver units 121 and 122 to drive the supplying-end coil 125 to supply power with an appropriate power level.

The signal analysis circuits 126 and 127 may obtain the coil signals C1 and C2 on the supplying-end coil 125, respectively, and convert the coil signals C1 and C2 into corresponding trigger data D1 and D2. In detail, the signal analysis circuit 126 is coupled between the processor 11 and a terminal of the supplying-end coil 125 that connected to the resonant capacitor 123, for receiving the coil signal C1, converting the coil signal C1 into a plurality of trigger data D1, and then transmitting the trigger data D1 to the processor 11. The signal analysis circuit 127 is coupled between the processor 11 and a terminal of the supplying-end coil 125 that connected to the resonant capacitor 124, for receiving the coil signal C2, converting the coil signal C2 into a plurality of trigger data D2, and then transmitting the trigger data D2 to the processor 11.

Subsequently, the processor 11 may perform interpretation on the trigger data D1 and D2, to determine whether the supplying-end module 100 receives the modulation data from the receiving-end module 200. The processor 11 may be a central processing unit (CPU), a microprocessor, a micro controller unit (MCU), or any other type of digital signal processing device or computation device. In an embodiment, the processor 11 may include multiple processing units, which may operate independently to accelerate the speed of signal processing. Different processing units may be different processor devices. Preferably, the processor 11 may be a dual-core processor or multi-core processor, which includes multiple cores operating independently to execute programs, and the multiple cores may transmit data to each other and share the same peripheral resources. Among the multiple cores, one core or processing unit is configured to capture and store the trigger data. In the present invention, since one trigger data is received within each high speed resonant cycle and its data rate is extremely high, a core or processing unit may be dedicated to data capture, in order to avoid a delay caused by other tasks such that the trigger data cannot be promptly obtained in each resonant cycle. Another core or processing unit is configured to perform the following data determination, analysis and decoding. It may calculate and analyze the features of data variations stored in the memory, and perform decoding according to the features of data. The calculation of data requires a longer time, but this core operates in a longer decoding cycle with a lower timeliness requirement; hence, the operations of data analysis will not be affected if the core is interrupted by another task.

Figure 2:
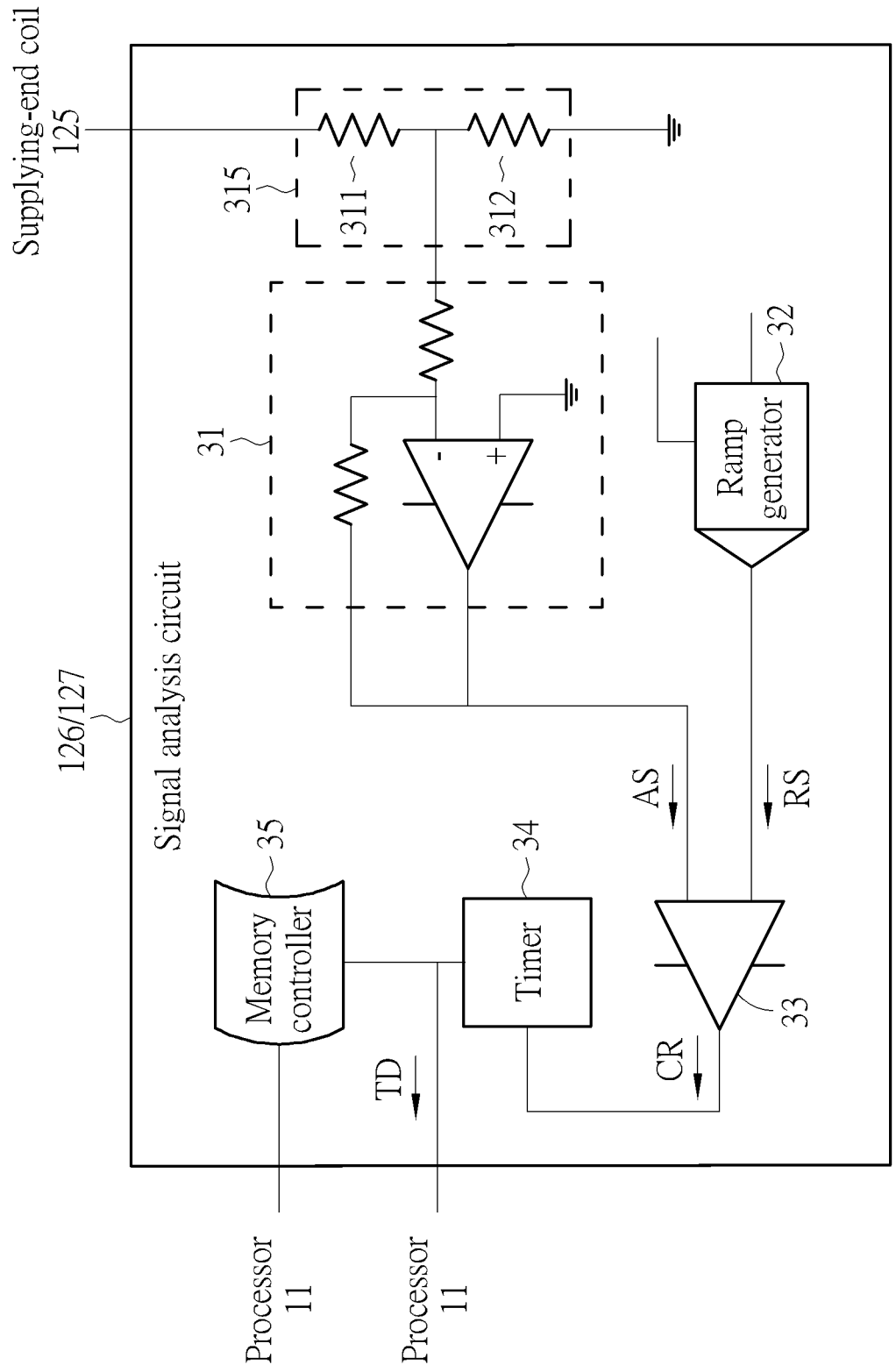
FIG. 2 is an exemplary implementation of the signal analysis circuits.

Please refer to FIG. 2, which is an exemplary implementation of the signal analysis circuits 126 and 127. As shown in FIG. 2, each of the signal analysis circuits 126 and 127 includes a signal receiving circuit 315, a gain amplifier 31, a ramp generator 32, a comparator 33, a timer 34 and a memory controller 35. In detail, the signal receiving circuit 315 may be a voltage dividing circuit, which includes voltage dividing resistors 311 and 312, for generating a voltage dividing signal after attenuating the coil signal C1 or C2. The gain amplifier 31 may receive the coil signal C1 or C2 with or without voltage division, and amplify and adjust the voltage of the coil signal C1 or C2 to generate an amplification signal AS. The gain amplifier 31 may be realized as any type of amplifier having a fixed gain or variable gain, which is not a limitation in the embodiments of the present invention. The ramp generator 32 is configured to generate and output a ramp signal RS. The ramp signal RS may be a periodic signal having rising or falling ramps, and its period length and slope are adjustable and may be controlled by the processor 11. The comparator 33 is configured to compare the amplification signal AS with the ramp signal RS to output a comparison result CR. In detail, the comparator 33 may determine a trigger time on which the amplification signal AS and the ramp signal RS intersect, which is obtained by monitoring the switching time point of the comparison result CR. The timer 34 may further obtain a time data TD corresponding to the trigger time, and output the time data TD to the processor 11. The memory controller 35 may control the specific address in the memory for storing each time data TD sequentially. For example, the memory may be the memory space embedded in the processor 11. The memory controller 35 may configure a specific memory segment and store the time data TD into this specific segment. The detailed implementations and operations of the signal analysis circuits 126 and 127 are illustrated in U.S. Application No. 2021/0172981, and will not be repeated herein.

Figure 3:
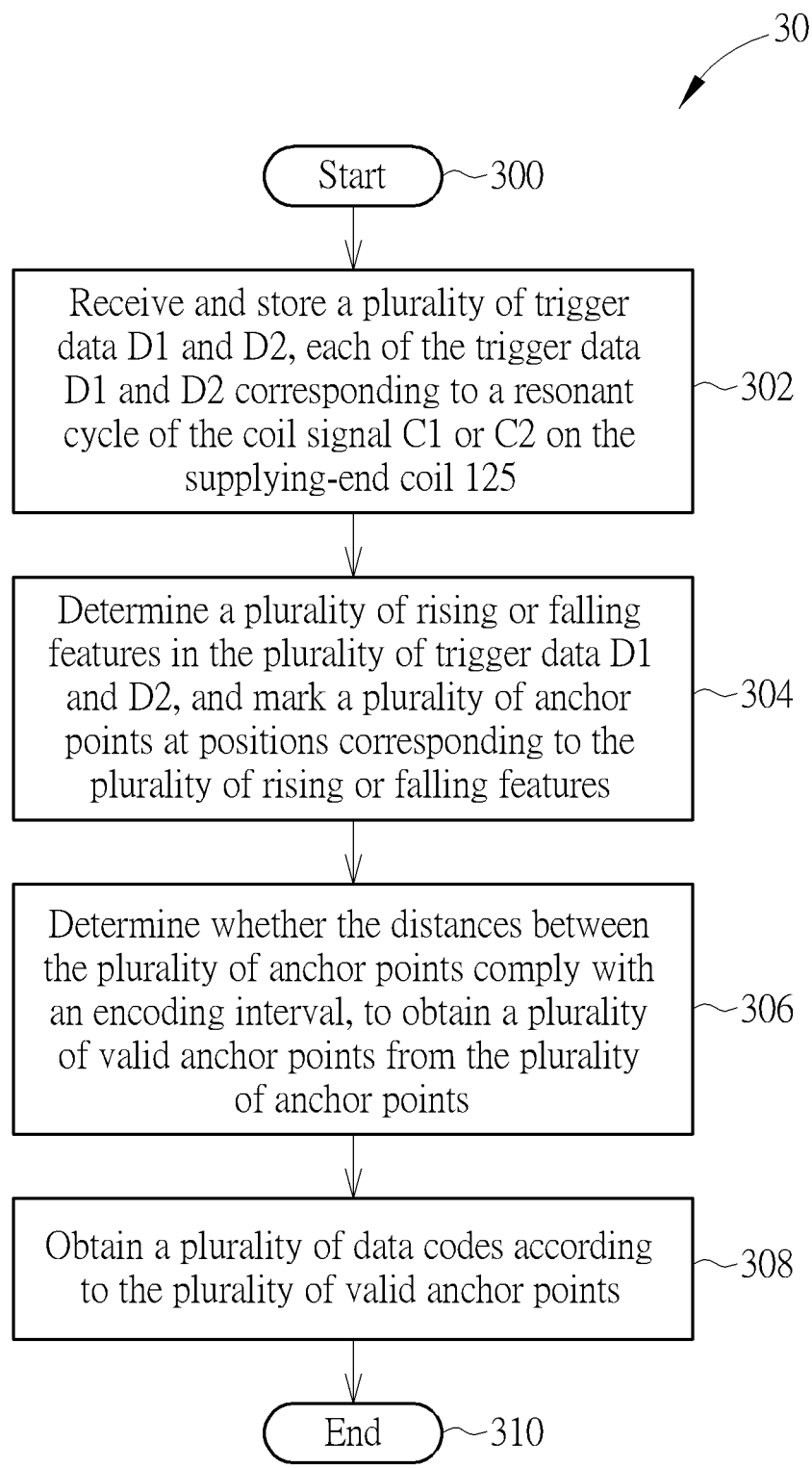
FIG. 3 is a flowchart of a decoding process according to an embodiment of the present invention.

Please refer to FIG. 3, which is a flowchart of a decoding process 30 according to an embodiment of the present invention. The decoding process 30 is used for a supplying-end module of an induction type power supply system such as the supplying-end module 100 shown in FIG. 1, for sensing the coil to interpret the modulation data carried on the coil signal. As shown in FIG. 3, the decoding process 30 includes the following steps:

Step 300: Start.

Step 302: Receive and store a plurality of trigger data D1 and D2, each of the trigger data D1 and D2 corresponding to a resonant cycle of the coil signal C1 or C2 on the supplying-end coil 125.

Step 304: Determine a plurality of rising or falling features in the plurality of trigger data D1 and D2, and mark a plurality of anchor points at positions corresponding to the plurality of rising or falling features.

Step 306: Determine whether the distances between the plurality of anchor points comply with an encoding interval, to obtain a plurality of valid anchor points from the plurality of anchor points.

Step 308: Obtain a plurality of data codes according to the plurality of valid anchor points.

Step 310: End.

According to the decoding process 30, the signal analysis circuit 126 and/or 127 in the supplying-end module 100 may first obtain the plurality of trigger data D1 and D2, wherein each trigger data corresponds to a resonant cycle of the coil signal C1 or C2 on the supplying-end coil 125. In an embodiment, the signal analysis circuits 126 and 127 may have the structure as shown in FIG. 2, to be configured to obtain the time data TD corresponding to each resonant cycle, where the time data TD refers to the trigger data D1 and D2 received and stored by the processor 11 in Step 302. The time data TD is used for indicating the time point on which a trigger of the coil signal occurs in the corresponding resonant cycle, i.e., the time point on which the amplification signal AS and the ramp signal RS intersect. Note that the trigger data D1 and D2 of the present invention are those data generated through a trigger appearing on the coil signal C1 or C2 by using any method, and a data value is obtained in each resonant cycle of the supplying-end coil 125, where the data values may be different following the variations of coil oscillations. Therefore, the above method of using the ramp generator 32 along with the comparator 33 to perform triggering and generate the time data TD is one of various implementations of the trigger data of the present invention. In another embodiment, the trigger data may be of another type, such as the voltage data corresponding to the amplitude of the coil signal. As long as the trigger data corresponds to a respective resonant cycle and is able to reflect the oscillations and variations generated from the modulation of the power receiving terminal performed on the coil signal, the trigger data may be utilized by the processor 11 to analyze and decode the modulation data.

Figure 4:
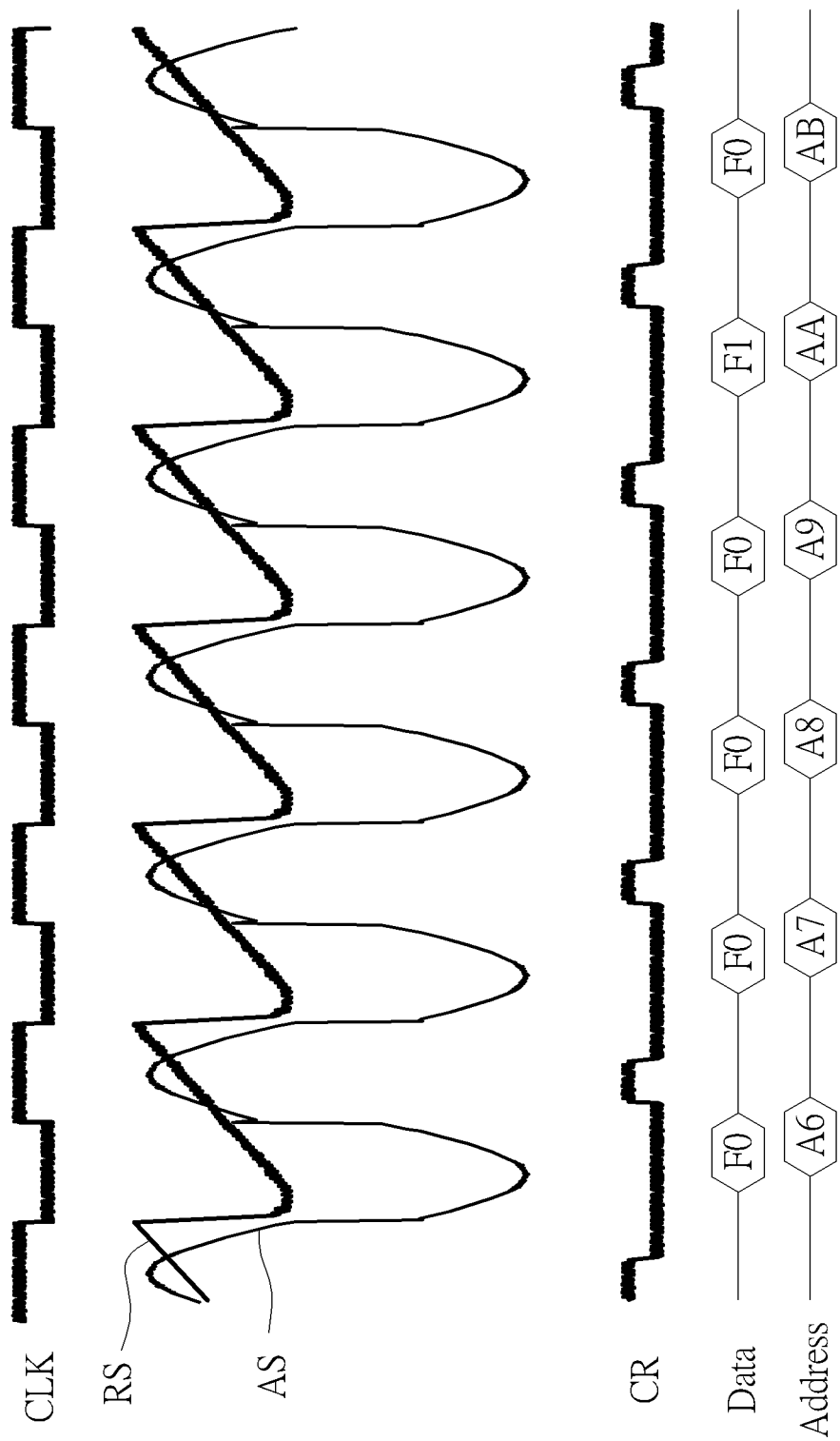
FIG. 4 is a schematic diagram of the resonance of the coil signal converted into the trigger data according to an embodiment of the present invention.

Please refer to FIG. 4, which is a schematic diagram of the resonance of the coil signal C1 or C2 converted into the trigger data according to an embodiment of the present invention. As shown in FIG. 4 along with FIGS. 1 and 2, which includes the waveforms of the clock signal CLK, the amplification signal AS, the ramp signal RS, and the comparison result CR and the address of their corresponding trigger data. The amplification signal AS is generated based on the coil signal C1 or C2, and thus may reflect the amplitude variations on the coil signal C1 or C2. The comparison result CR may be generated based on the comparison of the amplification signal AS and the ramp signal RS (e.g., through the comparator 33). The timer 34 may further generate the trigger data (i.e., the time data TD, which may be any of the trigger data D1 and D2 as shown in FIG. 1) according to the waveform of the comparison result CR. In this embodiment, each resonant cycle corresponding to a cycle of the clock signal CLK generates one trigger data. Every time when a trigger data is output to the processor 11, the processor 11 may control the memory controller 35 to increase the address, to control the trigger data to be sequentially stored in the corresponding memory addresses.

After the processor 11 receives the trigger data and stores them in the memory, the processor 11 may determine a plurality of rising or falling features in the trigger data, and mark a plurality of anchor points at the positions corresponding to these rising or falling features (Step 304). In detail, each of the trigger data comes from one oscillation of the coil, and the trigger data are generated continuously under high frequency oscillations. As mentioned above, the modulation operation may feed the signals back to the supplying-end coil 125 to generate variations with the oscillations of the coil signals C1 and C2, and the oscillating variations may change the values of the modulation data. That is, among a series of modulation data, when the feature of evident rising or falling of the values appears, the processor 11 may mark the position having an evident rising or falling feature as an anchor point and record its corresponding address. The processor 11 then stores the recorded address of the anchor point into the memory in sequence.

Figure 5:
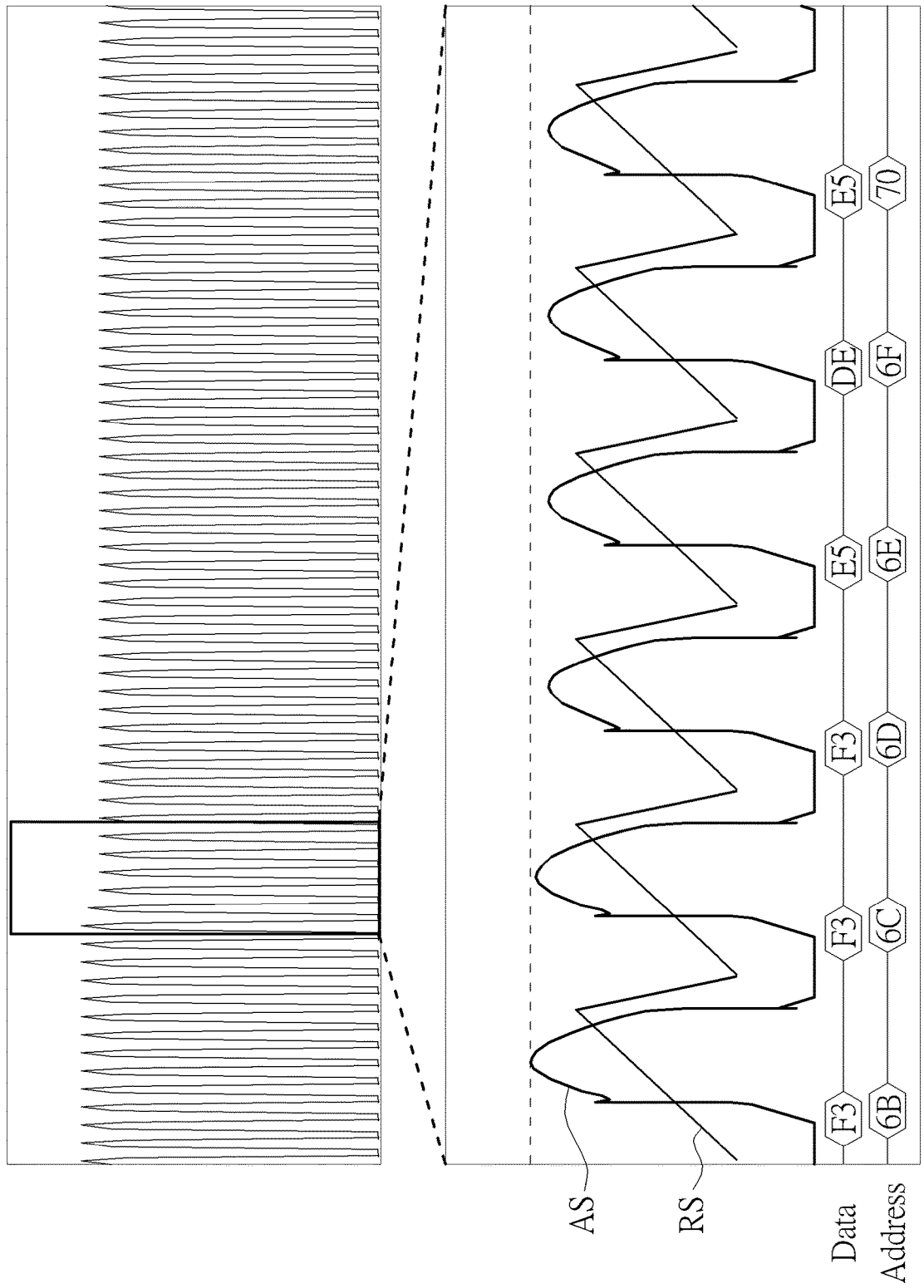
FIG. 5 is a schematic diagram of variations of coil oscillations causing the value of trigger data to change according to an embodiment of the present invention.

When there is no evident variation in the coil oscillations, the continuously generated trigger data may have equal or similar values. Taking FIG. 4 as an example, the trigger data varies between only the values F0 and F1 (denoted in hexadecimal), and the variations are quite small, which means there is no rising or falling feature. On the other hand, as shown in FIG. 5, when evident variations appear in the coil oscillations, the values of the generated trigger data will also change. In detail, as shown in FIG. 5, when the amplitude of coil oscillation decreases and thus the value of the trigger data falls from F3 to E5 and then to DE (denoted in hexadecimal), the falling feature appears, and the processor 11 may mark the address 6E or 6F where the falling feature appears as an anchor point. In this embodiment, a larger value of the trigger data stands for a larger amplitude of the coil signal, but the implementation of the present invention is not limited thereto. In another embodiment, if the trigger data is obtained in another manner, the relationship may become that a larger amplitude of the coil signal corresponds to a smaller trigger data.

Please note that, the coil signals C1 and C2 carry both the modulation signals from the power receiving terminal and the power signals to be delivered to the power receiving terminal. The power signals always have a great deal of noises, which easily interfere with the trigger data generated by the signal analysis circuit. In order to prevent the noise interferences from causing the modulation data to be wrongly interpreted, the processor 11 may ignore those oscillations having a smaller degree or shorter time. In an embodiment, the processor 11 may calculate the difference value between every two adjacent trigger data, and determine that a rising or falling feature appears when there are two consecutive difference values having the same direction and both greater than a threshold value, in order to mark an anchor point on the corresponding memory address where the rising or falling feature appears.

For example, the processor 11 may determine that a rising or falling feature appears when there are two consecutive difference values having the same direction and both greater than or equal to 5. Taking Table 1 as an example, the trigger data in the addresses 103-109 appear to be stable, and then two consecutive difference values greater than 5 appear in the addresses 109-111, where the two consecutive difference values are both in the falling direction (i.e., falling from 243 to 229 and from 229 to 222); hence, the address 111 may be marked as a falling anchor point. In addition, although the subsequent data still have small variations where the difference values between several adjacent trigger data are greater than or equal to 5, there is no situation that two consecutive difference values are in the same direction and both greater than or equal to 5; hence, the variations are considered as noises and thus ignored.

TABLE 1

| Address (hexadecimal) | Address (decimal) | Data (hexadecimal) | Data (decimal) |
|---|---|---|---|
| 67 | 103 | F3 | 243 |
| 68 | 104 | F3 | 243 |
| 69 | 105 | F3 | 243 |
| 6A | 106 | F3 | 243 |
| 6B | 107 | F3 | 243 |
| 6C | 108 | F3 | 243 |
| 6D | 109 | F3 | 243 |
| 6E | 110 | E5 | 229 |

TABLE 1-continued

| Address (hexadecimal) | Address (decimal) | Data (hexadecimal) | Data (decimal) |
|---|---|---|---|
| 6F | 111 | DE | 222 |
| 70 | 112 | E5 | 229 |
| 71 | 113 | E9 | 233 |
| 72 | 114 | E2 | 226 |
| 73 | 115 | E0 | 224 |
| 74 | 116 | E5 | 229 |
| 75 | 117 | E7 | 231 |
| 76 | 118 | E3 | 227 |

Similarly, the processor 11 may also determine the rising feature to obtain the rising anchor point in the same way. As shown in Table 2, the trigger data in the addresses 135-141 are stable, and then two consecutive difference values greater than or equal to 5 and having the same rising direction (i.e., rising from 227 to 239 and from 239 to 244) appear between the addresses 141-143; hence, the address 143 may be marked as a rising anchor point.

TABLE 2

| Address (hexadecimal) | Address (decimal) | Data (hexadecimal) | Data (decimal) |
|---|---|---|---|
| 87 | 135 | E3 | 227 |
| 88 | 136 | E4 | 228 |
| 89 | 137 | E3 | 227 |
| 8A | 138 | E4 | 228 |
| 8B | 139 | E2 | 226 |
| 8C | 140 | E4 | 228 |
| 8D | 141 | E3 | 227 |
| 8E | 142 | EF | 239 |
| 8F | 143 | F4 | 244 |
| 90 | 144 | F3 | 243 |
| 91 | 145 | F3 | 243 |
| 92 | 146 | F1 | 241 |
| 93 | 147 | F3 | 243 |
| 94 | 148 | F3 | 243 |
| 95 | 149 | F2 | 242 |
| 96 | 150 | F3 | 243 |

By the above method, the processor 11 may obtain the positions (i.e., the addresses of the memory in which the data are stored) of the rising anchor point and the falling anchor point. Subsequently, the processor 11 may further determine whether the obtained anchor point is a valid anchor point, as described below.

Figure 6:
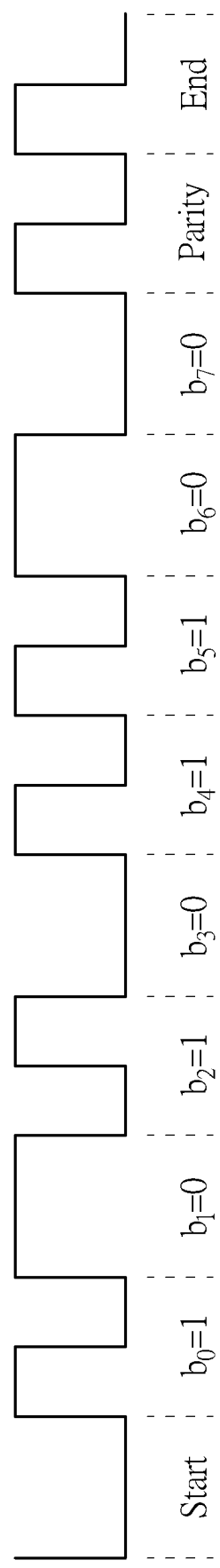
FIG. 6 illustrates an example of the encoding scheme of UART.

Most of the currently available induction type power supply devices perform wireless power transmission by using the Qi wireless charging standard developed by the Wireless Power Consortium (WPC). In the Qi wireless charging standard, the encoding scheme of the Universal Asynchronous Receiver Transmitter (UART) protocol is generally applied to perform data encoding. The encoding scheme of the UART protocol has a fixed time period, where the encoding format is that each data string consists of 11 bits which have 1 start bit, 8 data bits b0-b7, 1 parity bit and 1 end bit sequentially. The data string may carry 1 byte of data. These bits are composed of two states: "high" and "low", and each bit includes two state signals, as shown in FIG. 6. Between every two adjacent bits, there must be a transition of state signal (i.e., from high to low or from low to high). The bit value is defined as follows: the bit value is "1" if there is a signal transition at the middle point during the period of the bit; the bit is "0" if there is no signal transition during the period of the bit. In general, a series of "1"s are transmitted as a preamble before the transmission of the data string. The appearance of the first "0" (such as two consecutive "low" signals) refers to the start bit of the data string. After 8 bits of data are completely transmitted, what follows are the parity bit (whose value is determined based on odd parity check or even parity check) and the end bit (which must be "1").

According to the encoding scheme of the UART, each bit has a fixed period length equal to 0.5 millisecond (ms), and thus the encoding interval between a signal transition and its previous signal transition is in a basic unit of 0.25 ms, where the encoding interval may be defined to be 0.25 ms. Since there must be a transition between every two bits, the time length between two consecutive signal transitions should be equal to 0.25 ms or 0.5 ms. In an embodiment, a predetermined time interval may be set up, to capture the trigger data in this predetermined time interval. For example, the predetermined time interval may be set to 1 ms; hence, there are at most 4 signal transitions and at least 2 signal transitions in the predetermined time interval (depending on the data content). In addition, the processor 11 may further record the number of resonant cycles contained in each 1 ms time interval. Alternatively, since the resonant cycle of the coil signals C1 and C2 is determined based on the cycle of the clock signal CLK and the cycle of the clock signal CLK may be determined by the processor 11, the processor 11 may know the number of resonant cycles contained in each 1 ms time interval according to the cycle of the clock signal CLK. Assuming that the resonant frequency of the coil is 100 kilohertz (kHz), which means that there are 100 resonant cycles in each 1 ms time interval, the signal transition should appear on the position with an interval of 25 resonant cycles or 50 resonant cycles according to the above encoding method.

Please note that the induction type power supply system of the present invention is a variable-frequency power supply system, and the frequency of the resonant signal of the coil may change following the load states and/or environmental variations. For example, if the resonant frequency of the coil rises to 125 kHz, each 1 ms time interval may include 125 resonant cycles. Since the encoding interval of the UART remains unchanged (fixed on 0.25 ms), the signal transition will appear with an interval of 31-32 resonant cycles or 62-63 resonant cycles.

Therefore, after obtaining the rising anchor points and the falling anchor points, the processor 11 may further determine whether the distances between these anchor points comply with the encoding interval of the UART (i.e., determining whether these anchor points are at the positions corresponding to the encoding interval), so as to obtain the valid anchor points from these anchor points (Step 306). More specifically, when the processor 11 obtains an anchor point according to the rising or falling feature in the trigger data, the processor 11 may determine the distance between the anchor point and its previous anchor point. If the distance between this anchor point and its previous anchor point is equal to or close to an integral multiple of the above encoding interval (i.e., equal or double), the anchor point may be a valid anchor point. For example, when the resonant frequency of the coil is 100 kHz, the signal transition appears at the position with an interval of 25 resonant cycles or 50 resonant cycles; hence, the distance between two adjacent accurate anchor points is about 25 or 50 resonant cycles. As mentioned above, the trigger data corresponding to each resonant cycle is sequentially written into consecutive addresses of a memory segment. Therefore, the processor 11 may determine whether the address distance between a currently obtained anchor point and its previous anchor point is close to 25 or 50, such as determining whether the address distance is between 23-27 or 48-52, in order to determine whether the anchor point is a valid anchor point.

In contrast, if the address distance between a currently obtained anchor point and its previous anchor point is not located in a predict address distance (i.e., the distance between two anchor points does not comply with the encoding interval of the UART), the currently obtained anchor point may not be generated from an accurate modulation signal, and should be ignored or discarded.

In addition, the processor 11 should also determine whether the obtained anchor point and its previous anchor point have opposite rising or falling features, so as to determine the validity of the anchor point. In detail, when the processor 11 obtains a rising anchor point according to a rising feature in the trigger data, the processor 11 may determine whether the rising anchor point and its previous anchor point have opposite features; that is, determine whether the previous anchor point is a falling anchor point generated according to a falling feature in the trigger data. Since the modulation signal is switched between a high state and a low state, the appearance of a rising feature means that the previous anchor point should correspond to a falling feature; and the appearance of a falling feature means that the previous anchor point should correspond to a rising feature. Therefore, if an anchor point before a currently obtained rising anchor point is also a rising anchor point, or an anchor point before a currently obtained falling anchor point is also a falling anchor point, the currently obtained anchor point may not be generated from an accurate modulation signal, and should be ignored or discarded.

In addition, during the resonant process of the coil, the first appearance of the anchor point should be a falling anchor point, which corresponds to a falling feature in the trigger data. This is because the variations of trigger data are generated from signal modulation. The signal modulation of the power receiving terminal is performed by applying a load to the coil to decrease the coil voltage. That is, the modulation will decrease the coil voltage, and interrupting the modulation will make the coil voltage recover to its original level. As for the encoding scheme, the state signal "low" means that there is modulation, and the state signal "high" means that the modulation is interrupted. Therefore, when the modulation data starts to be transmitted, the observed first signal should be a high-to-low transition, which appears to be a falling anchor point.

As can be seen, the validity determination of the anchor point should satisfy two conditions. The first condition is that the distance (e.g., address distance) between the currently obtained anchor point and its previous anchor point should comply with the encoding interval of the UART; that is, the time difference between the appearances of two anchor points should be equal to or close to 0.25 ms or 0.5 ms. The second condition is that the currently obtained anchor point and its previous anchor point should have opposite rising or falling features. If an anchor point satisfies these two conditions, this anchor point may be determined as a valid anchor point, which is taken to be used for subsequent decoding operations.

In an embodiment, after the processor 11 obtains a valid anchor point, the trigger data before the valid anchor point may be discarded. In the embodiments of the present invention, the determination of valid anchor points is performed based on the comparison of the currently obtained anchor point and its previous valid anchor point; hence, after a first anchor point is determined as a valid anchor point, the next anchor point will be determined based on the first anchor point, and the information before the first anchor point is no longer effective, which may be discarded to let the memory space to be preserved for subsequent trigger data.

As mentioned above, in the supplying-end module of the present invention, a predetermined time interval for capturing the trigger data may be set up; that is, the operation timing of the processor 11 may be divided into multiple time intervals, and each time interval has a predetermined time length. Preferably, since the encoding interval of the UART is 0.25 ms, the length of the predetermined time interval may be set to an integral multiple of 0.25 ms, so that the processor 11 may well control the operations in each predetermined time interval. Based on the length of the predetermined time interval, the processor 11 may allocate a memory segment and sequentially write the trigger data within the time interval into consecutive addresses of the memory segment. Accordingly, the processor 11 may use the addresses to mark the anchor points according to the rising or falling features in the trigger data, and perform the determination of valid anchor points by the above method. In addition, the processor 11 may also obtain the number of resonant cycles contained in each time interval, to calculate the predicted address distance of valid anchor points based on the current resonant frequency. In a preferable embodiment, the length of a predetermined time interval may be set to 1 ms, so that the length of each predetermined time interval may be equal to 4 encoding intervals. In fact, in the embodiments of the present invention, a time interval used to capture the trigger data may have any length. It should be noted that, if the length of the time interval is too long, a larger memory space should be allocated to store the trigger data; and if the length of the time interval is too short, it is harder to calculate the accurate address distances of the anchor points.

In addition, since the induction type power supply system of the present invention is a variable-frequency system, when the resonant frequency of the coil changes, the number of resonant cycles contained in each time interval may also be variable. In such a situation, the processor 11 may adjust the determination of valid anchor points based on the variations of resonant frequency. For example, it is known that the encoding interval is 0.25 ms, and if the length of a time interval is set to 1 ms, the processor 11 may calculate that each time interval includes X trigger data according to the resonant frequency/cycle of the coil; hence, the address distance between adjacent valid anchor points that satisfies the encoding interval should be equal to or close to X/4 or X/2. When the resonant frequency and cycle of the coil change, the number X will also change. At this moment, the address distance between adjacent valid anchor points may also be adjusted.

Figure 7:
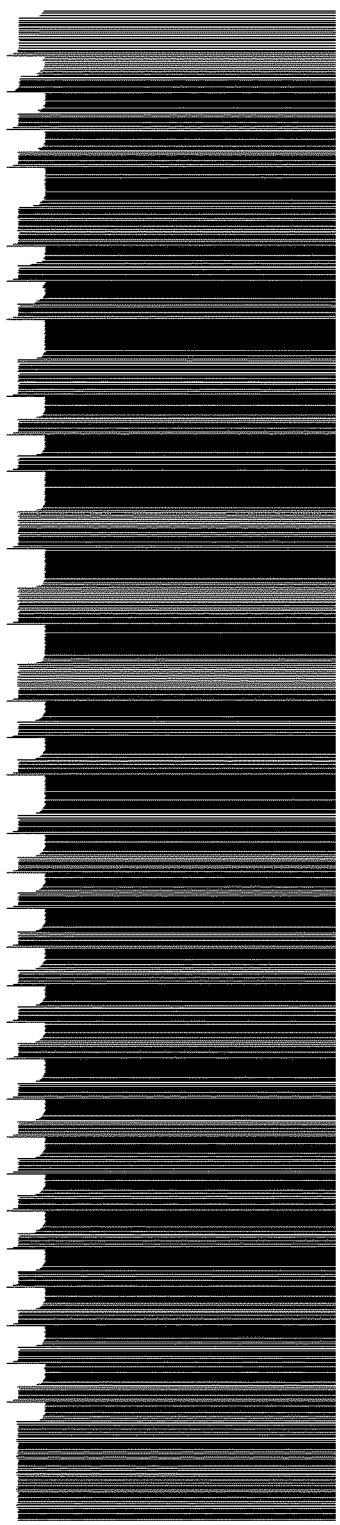
FIG. 7 is a schematic diagram of obtaining the data codes according to the valid anchor points according to an embodiment of the present invention.

After the processor 11 obtains the valid anchor points, the processor 11 may further obtain the data codes according to the valid anchor points (Step 308). Please refer to FIG. 7, which is a schematic diagram of obtaining the data codes according to the valid anchor points according to an embodiment of the present invention. FIG. 7 illustrates the modulation signals carried on the coil signal C1 or C2. According to the abovementioned method, the processor 11 may capture the state signals in the modulation signals and digitize the state signals to represent them by using "1" and "0". In detail, the processor 11 may obtain the anchor points according to the rising or falling features in the coil signal C1 or C2 and determine the valid anchor points. A signal value "0" may be generated and output when a valid rising anchor point appears, and a signal value "1" may be generated and output when a valid falling anchor point appears. The number of generated signal value(s) corresponds to the distance between the current anchor point and the previous anchor point.

In detail, supposing that the processor 11 obtains a valid anchor point which is a rising anchor point, based on the address distance of this rising anchor point and its previous falling anchor point, 1 state signal "0" is written if the address distance corresponds to a single encoding interval (i.e., 0.25 ms), and 2 state signals "0" are written if the address distance corresponds to double encoding intervals (i.e., 0.5 ms). Similarly, supposing that the processor 11 obtains a valid anchor point which is a falling anchor point, based on the address distance of this falling anchor point and its previous rising anchor point, 1 state signal "1" is written if the address distance corresponds to a single encoding interval (i.e., 0.25 ms), and 2 state signals "1" are written if the address distance corresponds to double encoding intervals (i.e., 0.5 ms). Other anchor points not having the distance equal or close to the single or double encoding interval are all considered as noises rather than valid anchor points.

Subsequently, based on the encoding rule of the UART, a preamble consisting of a series of signals "1010 . . . " may first be received, which is followed by two consecutive signals "0" as the start bit, which is further followed by the bit data. As a result, the processor 11 may obtain the $1^{st}$ byte of data codes "11000000", as shown in FIG. 7. Next, the $2^{nd}$ byte may be transmitted following the $1^{st}$ byte. The processor 11 may capture the subsequent data bits based on the same encoding rule, and the related implementations should be well known by those skilled in the art and will not be detailed herein.

Please note that the present invention aims at providing a decoding method for the induction type power supply system, allowing the supplying-end module to effectively interpret the modulation data received from the power receiving terminal through the coil signal. Those skilled in the art may make modifications and alterations accordingly. For example, in the above embodiments, the encoding method of the UART used in the Qi wireless charging standard is applied to perform decoding. However, in another embodiment, if the induction type power supply system uses another encoding method, the related decoding method may also be applied correspondingly. No matter which encoding method is applied, as long as the modulation signal is fed back by changing the signal on the supplying-end coil, the signal analysis circuit of the present invention is able to obtain the trigger data, and the processor is able to analyze the state signals "high" and "low" (or called signal values "1" and "0") based on the same method and generate accurate data codes according to the corresponding decoding method. In addition, in the embodiments of the present invention, the signal analysis circuit may be coupled to any terminal of the supplying-end coil to detect the coil signal. For example, in FIG. 1, the signal analysis circuit 126 may be deployed to detect the coil signal C1 between the supplying-end coil 125 and the resonant capacitor 123, or the signal analysis circuit 127 may be deployed to detect the coil signal C2 between the supplying-end coil 125 and the resonant capacitor 124. Since the coil signals C1 and C2 are inverse to each other and both of them carry the modulation signals, the interpretation of modulation data may be realized no matter whether the coil signal C1 or C2 is applied. In another embodiment, the signal analysis circuits 126 and 127 may both be deployed to detect both the coil signals C1 and C2 to obtain respective trigger data. In such a situation, the processor 11 may obtain the anchor points based on the trigger data generated by the signal analysis circuits 126 and 127, and combine the anchor points of both terminals to determine the valid anchor points.

In detail, the signal analysis circuit 126 may obtain a plurality of first trigger data from the coil signal C1, where the first trigger data correspond to the node between the supplying-end coil 125 and the resonant capacitor 123. According to the first trigger data, the processor 11 may determine the rising or falling features therein, to generate a plurality of first anchor points. Similarly, the signal analysis circuit 127 may obtain a plurality of second trigger data from the coil signal C2, where the second trigger data correspond to the node between the supplying-end coil 125 and the resonant capacitor 124. According to the second trigger data, the processor 11 may determine the rising or falling features therein, to generate a plurality of second anchor points. Subsequently, the processor 11 combines the first anchor points and the second anchor points to generate a plurality of anchor points, in order to determine the validity of the plurality of anchor points and perform subsequent data interpretation according to the valid anchor points.

In the above embodiment, the processor 11 may generate respective first anchor points and second anchor points from the first trigger data and the second trigger data, respectively. Preferably, at a predetermined address where a valid anchor point may appear, the processor 11 may mark the address as a valid anchor point as long as any of the first trigger data or the second trigger data includes a rising or falling feature. For example, based on the abovementioned determination criterion associated with the rising or falling feature (i.e., two consecutive difference values having the same direction and both greater than a threshold value), the processor 11 may determine that the first trigger data has a rising or falling feature but the second trigger data does not have a rising or falling feature, and mark a first anchor point at the corresponding address but not mark a second anchor point. After combination, the processor 11 may still consider this address as a valid anchor point. In other words, as long as the signal on a terminal of the supplying-end coil 125 is determined to have a feature of anchor point and this anchor point satisfies the validity determination, this anchor point may be considered as an accurate anchor point used to perform data decoding. This method can reduce the possibility that an accurate anchor point fails to be recognized. In general, in the noisy wireless power supply system, a wrong determination may occur if a position without rising or falling modulation is wrongly determined as an anchor point due to noises, or a position of an anchor point having a rising or falling modulation is not accurately interpreted. The former is usually removed during the validity determination (since those anchor points not appearing at specific time points are determined to be invalid), and the latter may be improved by the above method of detecting the anchor points corresponding to both sides of the coil and combining them.

Another common situation is that a first anchor point and a second anchor point appear at adjacent addresses. This is because the coil signals C1 and C2 are inverse signals, and the trigger data is usually obtained through the triggering in the positive voltage range, so that the rising or falling features on the coil signals C1 and C2 have a time difference of one half resonant cycle. In such a situation, the processor 11 may combine the first anchor point and the second anchor point appearing on adjacent addresses to a single anchor point.

Figure 8:
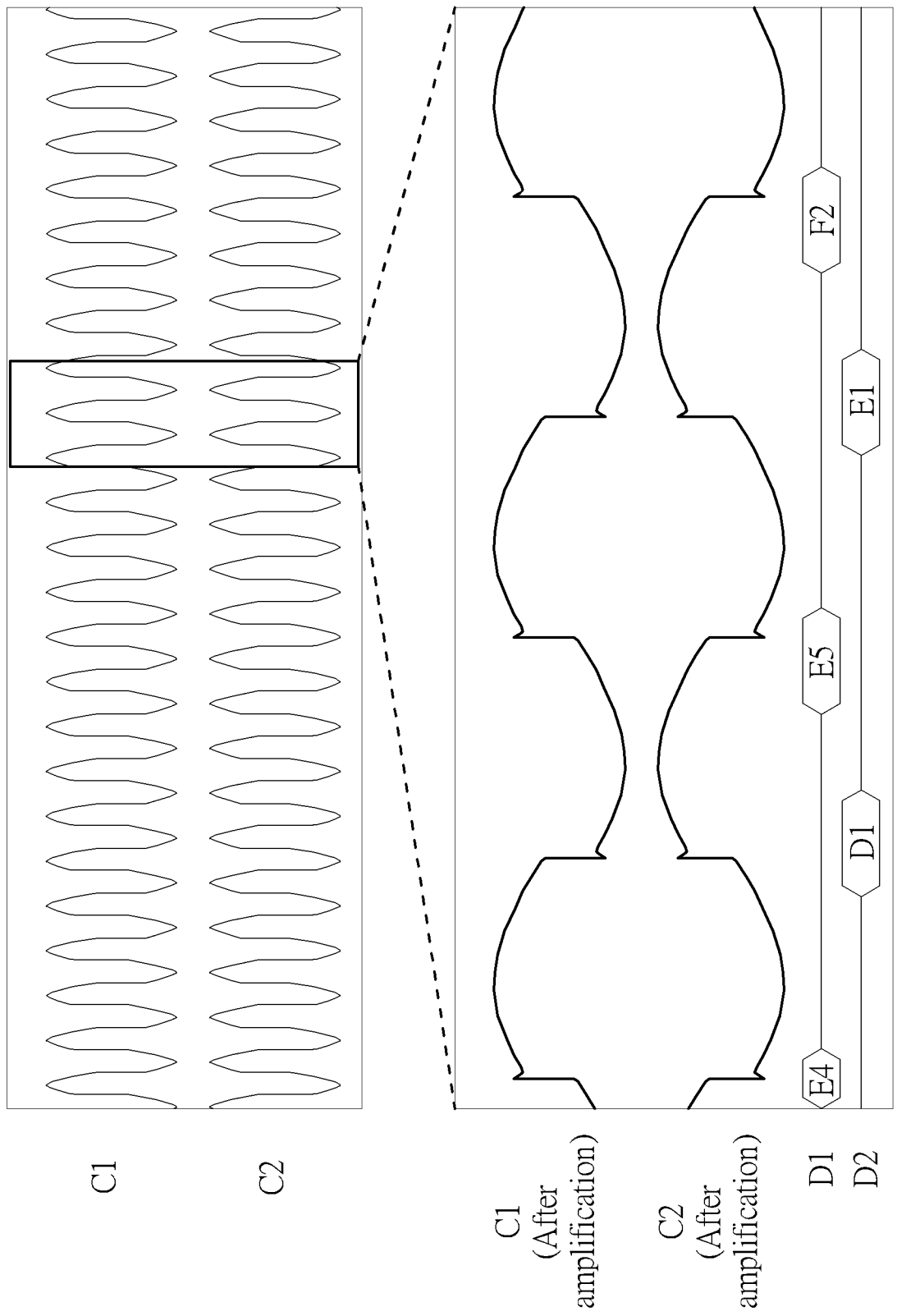
FIG. 8 is a schematic diagram of obtaining the coil signals and their corresponding trigger data according to an embodiment of the present invention.

Please refer to FIG. 8, which is a schematic diagram of obtaining the coil signals C1 and C2 and their corresponding trigger data D1 and D2 according to an embodiment of the present invention. As shown in FIG. 8, the coil signals C1 and C2 are inverse to each other. Since the trigger data D1 and D2 are obtained by using the positive voltage range to perform triggering, they have a time difference of one half cycle.

Table 3 further illustrates an exemplary implementation of obtaining the anchor points according to the trigger data D1 and D2 and combining them, where the trigger data D1 and D2 appear to have an evident rising feature. However, according to the above determination criterion associated with the rising or falling feature (i.e., two consecutive difference values having the same direction and both greater than or equal to the threshold value 5), the trigger data D1 only includes a difference value between the addresses 42-43 greater than 5 but there are no two consecutive difference values greater than 5; hence, the corresponding anchor point is not generated. On the other hand, in the trigger data D2, there are two consecutive difference values between the addresses 41-43 greater than 5 and having the same rising direction, and thus it is determined as a rising anchor point. After combination, the address 43 should be marked as an anchor point to perform subsequent interpretation.

TABLE 3

| Address (decimal) | D1 (hexadecimal) | D1 (decimal) | D2 (hexadecimal) | D2 (decimal) |
| --- | --- | --- | --- | --- |
| 34 | E5 | 229 | D5 | 213 |
| 35 | E5 | 229 | D5 | 213 |
| 36 | E5 | 229 | D6 | 214 |
| 37 | E4 | 228 | D5 | 213 |
| 38 | E4 | 228 | D5 | 213 |
| 39 | E4 | 228 | D5 | 213 |
| 40 | E5 | 229 | D5 | 213 |
| 41 | E4 | 228 | D1 | 209 |
| 42 | E5 | 229 | E1 | 225 |
| 43 | F2 | 242 | E9 | 233 |
| 44 | F2 | 242 | E9 | 233 |
| 45 | F3 | 243 | EA | 234 |
| 46 | F4 | 244 | E9 | 233 |
| 47 | F4 | 244 | EA | 234 |
| 48 | F4 | 244 | EA | 234 |

As can be seen, the method of detecting the rising or falling features of both the trigger data D1 and D2 to correspondingly obtain the anchor points and then performing combination may improve the accuracy of anchor point determination, so that the subsequent decoding operation will be more reliable.

Figure 9A:
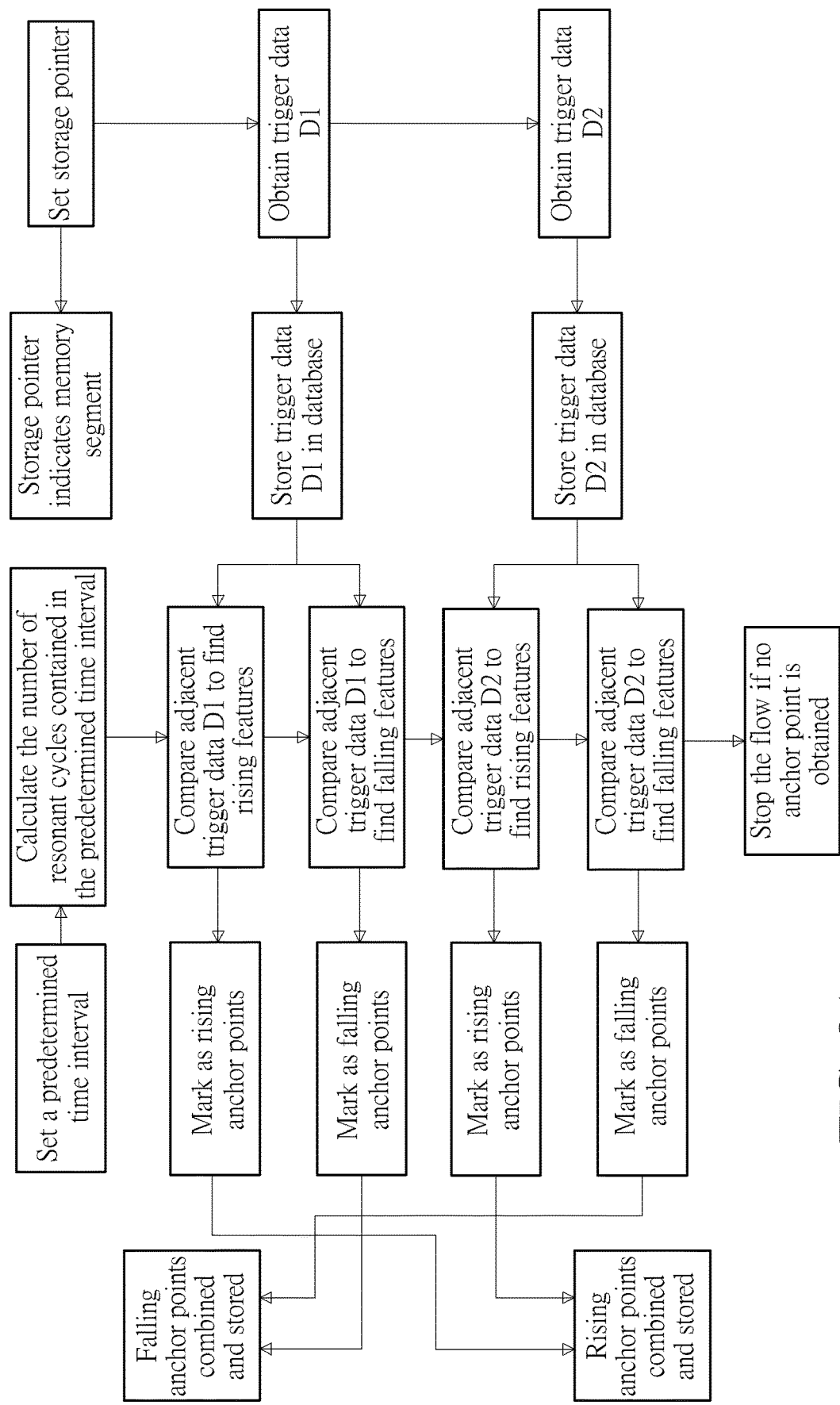
FIG. 9A and FIG. 9B are detailed flowcharts for the supplying-end processor according to an embodiment of the present invention.
Figure 9B:
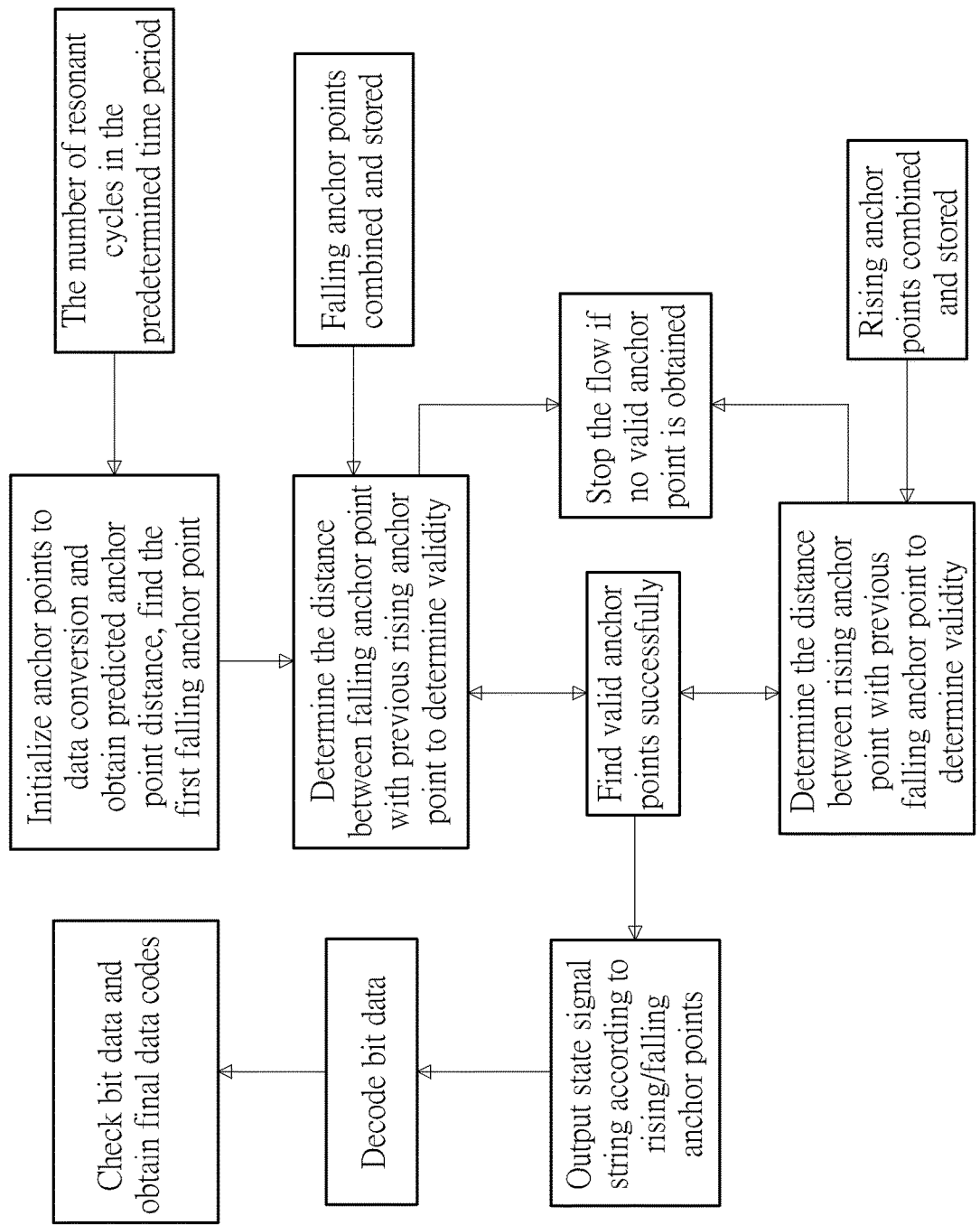

Please refer to FIGS. 9A and 9B, which are detailed flowcharts for the supplying-end processor according to an embodiment of the present invention. In the flowcharts, the decoding of modulation data may be realized by controlling the processor 11 through program codes along with the operations of the signal analysis circuits 126 and 127. As shown in FIG. 9A, when starting the data decoding, the processor 11 first sets a storage pointer to obtain the trigger data D1 and D2 from the signal analysis circuits 126 and 127, respectively, and stores the trigger data D1 and D2 in the database (i.e., memory). The storage pointer is used for indicating the position of the memory where the trigger data D1 and D2 are stored, which is equivalent to the memory address in the above embodiments. In this embodiment, the storage pointer may map the sequentially received trigger data D1 and D2 to consecutive address values or time stamps, to facilitate the subsequent calculation of anchor point distances. The system may configure an appropriate segment in the memory to store the trigger data D1 and D2.

If the segment is full of data, the newly received trigger data D1 and D2 will overwrite old data from the beginning with circulatory. In general, the older trigger data D1 and D2 may be discarded after the corresponding valid anchor point is obtained. The applied memory may be a random access memory (RAM), but not limited thereto.

Subsequently, a predetermined time interval may be set in the system. The length of this predetermined time interval may be determined according to the encoding rule. In a preferable embodiment, the used encoding scheme is the UART encoding method specified by the Qi wireless charging standard, and its encoding interval is 0.25 ms. Therefore, the length of the predetermined time interval may be set to 1 ms, and the number of resonant cycles of coil contained in the predetermined time interval may be calculated. Subsequently, the processor 11 compares the adjacent trigger data D1 and D2 one by one to search for the rising/falling features, and correspondingly marks the addresses or time corresponding to the rising anchor points and the falling anchor points. The rising anchor points of the trigger data D1 and D2 are combined and stored, and the falling anchor points of the trigger data D1 and D2 are combined and stored. During the combining process, multiple anchor points in adjacent positions may be combined to one anchor point. As long as an anchor point appears in any one of the trigger data D1 and D2, the processor 11 may determine that an anchor point exists and store the anchor point. Note that if there is no anchor point obtained in a predetermined time interval, the processor 11 may stop subsequent operations and restart in the next decoding cycle. In other words, if no anchor point is obtained, which means that the power receiving terminal does not send any modulation signal at this time, the processor 11 may stop the subsequent process to save computation source and power consumption.

As shown in FIG. 9B, when an anchor point is obtained successfully, the processor 11 may initialize the conversion process of anchor points to data, and obtain a predicted distance of valid anchor points (i.e., the address distance that should possess between two adjacent valid anchor points) based on the number of resonant cycles contained in a predetermined time interval calculated previously. Subsequently, the processor 11 determines the validity based on the rising anchor points and the falling anchor points along with the predicted distance of anchor points, and then converts the anchor points into a state signal string after the validity is determined successfully. In detail, the first anchor point to be found has the falling direction as a falling anchor point, and then rising and falling anchor points appear alternately. If the distance between the found anchor point and its previous anchor point is 1 time the encoding interval, 1 state signal is written; if the distance between the found anchor point and its previous anchor point is 2 times the encoding interval, 2 state signals are written. The rising anchor point and the falling anchor point correspond to the output state signals "0" and "1", respectively. Similarly, in this step, if no valid anchor point is obtained in this predetermined time interval, the processor 11 may stop the subsequent process to save computation source and power consumption.

Please note that, before starting to receive the anchor points, the processor 11 should initialize the conversion process of anchor points to data. Because the modulation data includes a series of data bits transmitted continuously based on the predetermined encoding format, the modulation data includes a preamble, a header, and main data codes, etc. When the processor 11 determines that the anchor points start to be received, the processor 11 should perform initialization and identify the preamble and header, in order to know that the data bits are at which positions and start to perform data decoding. In addition, when the data bits are not completely received but there is no valid anchor point obtained for a period of time, the processor 11 may determine that the data is interrupted or lost and restart to perform initialization.

Subsequently, after obtaining the state signal string, the processor 11 may recover the original data codes according to the corresponding encoding method, and then check the data to obtain the final data after decoding. This data should be the same as the modulation data output by the receiving-end module. As mentioned above, according to the encoding scheme of the UART, each data string includes 11 bits, which correspond to 22 state signals; hence, the processor 11 may configure a state signal counter, which starts to count when the start bit is identified, until the 22 state signals are completely received. The obtained 22 state signals are further decoded to generate 11 bit data, where the parity bit is used to perform checking. The data codes will be output after they are confirmed to be accurate. Similarly, in this step, if 22 state signals cannot be successfully captured, the processor 11 may determine that parts of the data are lost, and stop subsequent decoding and checking processes to save computation source and power consumption.

To sum up, the present invention provides a decoding method for modulation data of an induction type power supply system, where the signal analysis circuit(s) of the supplying-end module may convert the coil signals into trigger data, and a trigger data is obtained in each resonant cycle of the coil signal. Subsequently, the processor obtains the anchor points according to the rising or falling features of the trigger data; that is, the processor sequentially compares the difference between two adjacent trigger data to determine whether there is explicitly a rising or falling feature, in order to mark the address of trigger data that complies with the rising or falling feature as a rising anchor point or falling anchor point. In an embodiment, the processor may respectively obtain the trigger data and anchor points corresponding to the two terminals of the supplying-end coil, and combine the anchor points on the two terminals of the coil. Through the method of detecting the signals on both terminals of the coil to obtain the anchor points and then combining the anchor points, the reliability of obtaining the signals may be improved. Subsequently, the processor may compare the distance between the anchor points and their direction to obtain the valid anchor points. Since the wrong anchor points generated from noise interferences are usually not located at the predicted distance, the processor may compare the distance of anchor points to determine whether it complies with the encoding interval, so as to effectively remove the wrong anchor points and maintain the accurate valid anchor points. The processor then converts the valid anchor points into state signals, and returns the state signals to data codes according to the encoding format, to complete the decoding of modulation data. Through the above decoding method, the present invention may realize the interpretation and decoding of modulation data without using a filter, to effectively improve the performance of receiving the modulation data in the induction type power supply system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding method for a supplying-end module of an induction type power supply system, the supplying-end module comprising a supplying-end coil, the decoding method comprising:
   receiving and storing a plurality of trigger data, each corresponding to a resonant cycle of a coil signal on the supplying-end coil;
   determining a plurality of rising or falling features in the plurality of trigger data, and marking a plurality of anchor points at positions corresponding to the plurality of rising or falling features;
   determining whether distances between the plurality of anchor points comply with an encoding interval, to obtain a plurality of valid anchor points from the plurality of anchor points; and
   obtaining a plurality of data codes according to the plurality of valid anchor points.

2. The decoding method of claim 1, wherein the step of determining whether the distances between the plurality of anchor points comply with the encoding interval to obtain the plurality of valid anchor points from the plurality of anchor points comprises:
   determining an anchor point corresponding to a position of a second rising or falling feature among the plurality of rising or falling features as a valid anchor point when the second rising or falling feature is opposite to a first rising or falling feature among the plurality of rising or falling features prior to the second rising or falling feature and a distance between the second rising or falling feature and the first rising or falling feature is equal to or close to an integral multiple of the encoding interval.

3. The decoding method of claim 1, wherein the step of determining the plurality of rising or falling features in the plurality of trigger data comprises:
   calculating a difference value of every two adjacent trigger data among the plurality of trigger data; and
   determining a rising or falling feature among the plurality of rising or falling features appears when there are two consecutive difference values having the same direction and greater than a threshold value.

4. The decoding method of claim 3, wherein the plurality of trigger data are sequentially stored in a plurality of addresses of a memory, and the step of marking the plurality of anchor points at the positions corresponding to the plurality of rising or falling features comprises:
   marking an address of a trigger data corresponding to a rising or falling feature as an anchor point among the plurality of anchor points when one of the plurality of rising or falling features appears.

5. The decoding method of claim 1, wherein each of the plurality of trigger data comprises a time data indicating a time point at which a trigger on the coil signal appears in the corresponding resonant cycle.

6. The decoding method of claim 1, wherein the step of receiving and storing the plurality of trigger data is performed by a first processing unit, and the steps of determining the plurality of rising or falling features in the plurality of trigger data, determining whether the distances between the plurality of anchor points comply with the encoding interval, and obtaining the plurality of data codes according to the plurality of valid anchor points are performed by a second processing unit.

7. The decoding method of claim 1, wherein the encoding interval is equal to 0.25 millisecond.

8. The decoding method of claim 1, wherein the coil signal comprises a first resonant signal on a first terminal of the supplying-end coil and a second resonant signal on a second terminal of the supplying-end coil, and the plurality of trigger data are received from the first resonant signal and the second resonant signal.

9. The decoding method of claim 8, further comprising:
   receiving and storing a plurality of first trigger data corresponding to the first terminal of the supplying-end coil;
   receiving and storing a plurality of second trigger data corresponding to the second terminal of the supplying-end coil;
   determining the plurality of rising or falling features in the plurality of first trigger data to generate a plurality of first anchor points;
   determining the plurality of rising or falling features in the plurality of second trigger data to generate a plurality of second anchor points; and
   combining the plurality of first anchor points and the plurality of second anchor points to generate the plurality of anchor points.

10. The decoding method of claim 1, wherein the step of obtaining the plurality of data codes according to the plurality of valid anchor points comprises:
    generating at least one first signal value when a first rising anchor point appears in the plurality of valid anchor points, wherein a number of the at least one first signal value corresponds to a distance between the first rising anchor point and a previous falling anchor point; and
    generating at least one second signal value when a first falling anchor point appears in the plurality of valid anchor points, wherein a number of the at least one second signal value corresponds to a distance between the first falling anchor point and a previous rising anchor point.

11. A supplying-end module for an induction type power supply system, comprising:
    a supplying-end coil;
    a signal analysis circuit, coupled to the supplying-end coil, configured to obtain a plurality of trigger data; and
    a processor, coupled to the signal analysis circuit, configured to perform steps of:
       receiving a plurality of trigger data from the signal analysis circuit and storing the plurality of trigger data, wherein each of the plurality of trigger data corresponds to a resonant cycle of a coil signal on the supplying-end coil;
       determining a plurality of rising or falling features in the plurality of trigger data, and marking a plurality of anchor points at positions corresponding to the plurality of rising or falling features;
       determining whether distances between the plurality of anchor points comply with an encoding interval, to obtain a plurality of valid anchor points from the plurality of anchor points; and
       obtaining a plurality of data codes according to the plurality of valid anchor points.

12. The supplying-end module of claim 11, wherein the processor is further configured to perform the following step to determine whether the distances between the plurality of anchor points comply with the encoding interval to obtain the plurality of valid anchor points from the plurality of anchor points:
    determining an anchor point corresponding to a position of a second rising or falling feature among the plurality of rising or falling features as a valid anchor point when the second rising or falling feature is opposite to a first rising or falling feature among the plurality of rising or falling features prior to the second rising or falling feature and a distance between the second rising or falling feature and the first rising or falling feature is equal to or close to an integral multiple of the encoding interval.

13. The supplying-end module of claim 11, wherein the processor is further configured to perform the following steps to determine the plurality of rising or falling features in the plurality of trigger data:
calculating a difference value of every two adjacent trigger data among the plurality of trigger data; and
determining a rising or falling feature among the plurality of rising or falling features appears when there are two consecutive difference values having the same direction and greater than a threshold value.

14. The supplying-end module of claim 13, wherein the plurality of trigger data are sequentially stored in a plurality of addresses of a memory, and the processor is further configured to perform the following step to mark the plurality of anchor points at the positions corresponding to the plurality of rising or falling features:
marking an address of a trigger data corresponding to a rising or falling feature as an anchor point among the plurality of anchor points when one of the plurality of rising or falling features appears.

15. The supplying-end module of claim 11, wherein each of the plurality of trigger data comprises a time data indicating a time point at which a trigger on the coil signal appears in the corresponding resonant cycle.

16. The supplying-end module of claim 11, wherein the steps of receiving the plurality of trigger data from the signal analysis circuit and storing the plurality of trigger data are performed by a first processing unit of the processor, and the steps of determining the plurality of rising or falling features in the plurality of trigger data, determining whether the distances between the plurality of anchor points comply with the encoding interval, and obtaining the plurality of data codes according to the plurality of valid anchor points are performed by a second processing unit of the processor.

17. The supplying-end module of claim 11, wherein the encoding interval is equal to 0.25 millisecond.

18. The supplying-end module of claim 11, wherein the coil signal comprises a first resonant signal on a first terminal of the supplying-end coil and a second resonant signal on a second terminal of the supplying-end coil, and the plurality of trigger data are received from the first resonant signal and the second resonant signal.

19. The supplying-end module of claim 18, wherein the processor is further configured to perform steps of:
receiving and storing a plurality of first trigger data corresponding to the first terminal of the supplying-end coil;
receiving and storing a plurality of second trigger data corresponding to the second terminal of the supplying-end coil;
determining the plurality of rising or falling features in the plurality of first trigger data to generate a plurality of first anchor points;
determining the plurality of rising or falling features in the plurality of second trigger data to generate a plurality of second anchor points; and
combining the plurality of first anchor points and the plurality of second anchor points to generate the plurality of anchor points.

20. The supplying-end module of claim 11, wherein the processor is further configured to perform the following steps to obtain the plurality of data codes according to the plurality of valid anchor points:
generating at least one first signal value when a first rising anchor point appears in the plurality of valid anchor points, wherein a number of the at least one first signal value corresponds to a distance between the first rising anchor point and a previous falling anchor point; and
generating at least one second signal value when a first falling anchor point appears in the plurality of valid anchor points, wherein a number of the at least one second signal value corresponds to a distance between the first falling anchor point and a previous rising anchor point.

* * * * *